(12) United States Patent
Furuya (10) Patent No.: US 7,909,135 B2
(45) Date of Patent: Mar. 22, 2011

(54) SILENCER AND ELECTRONIC APPARATUS HAVING THE SAME

(75) Inventor: Hiroyuki Furuya, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/041,485

(22) Filed: Mar. 3, 2008

(65) Prior Publication Data

US 2008/0169152 A1   Jul. 17, 2008

Related U.S. Application Data

(63) Continuation of application No. PCT/JP2005/016100, filed on Sep. 2, 2005.

(51) Int. Cl.
*E04F 17/04* (2006.01)
(52) U.S. Cl. .............. 181/224; 181/212; 415/211.1; 415/211.2
(58) Field of Classification Search .......... 181/224, 181/212, 225, 200, 202; 415/211.1, 211.2
See application file for complete search history.

(56) References Cited

U.S. PATENT DOCUMENTS

| | | | | |
|---|---|---|---|---|
| 1,938,798 A | * | 12/1933 | Bourne | 454/206 |
| 1,938,801 A | * | 12/1933 | Bourne et al. | 454/338 |
| 1,964,845 A | * | 7/1934 | Dietze et al. | 454/206 |
| 2,176,319 A | * | 10/1939 | Anderson | 454/236 |
| 4,116,269 A | * | 9/1978 | Ikeda | 165/126 |
| 4,135,603 A | * | 1/1979 | Dean et al. | 181/286 |
| 4,877,106 A | * | 10/1989 | Neville et al. | 181/224 |
| 5,110,258 A | * | 5/1992 | Morinushi et al. | 415/119 |
| 5,199,846 A | * | 4/1993 | Fukasaku et al. | 415/119 |
| 5,299,634 A | * | 4/1994 | Toyoda et al. | 165/135 |
| 5,313,803 A | * | 5/1994 | Detzer | 62/89 |
| 5,326,317 A | * | 7/1994 | Ishizu et al. | 454/354 |
| 5,526,228 A | * | 6/1996 | Dickson et al. | 361/695 |
| 5,978,217 A | * | 11/1999 | Kerrigan et al. | 361/694 |
| 6,086,476 A | * | 7/2000 | Paquin et al. | 454/184 |
| 6,104,608 A | * | 8/2000 | Casinelli et al. | 361/692 |
| 6,288,897 B1 | * | 9/2001 | Fritschle et al. | 361/687 |
| 6,342,005 B1 | * | 1/2002 | Daniels et al. | 454/338 |
| 6,481,527 B1 | * | 11/2002 | French et al. | 181/201 |
| 6,491,133 B2 | * | 12/2002 | Yamada et al. | 181/200 |
| 6,618,248 B1 | * | 9/2003 | Dalheimer | 361/687 |
| 6,967,845 B2 | * | 11/2005 | Chiang et al. | 361/709 |
| 6,988,057 B2 | * | 1/2006 | Huang et al. | 702/191 |
| 7,314,113 B2 | * | 1/2008 | Doll | 181/225 |
| 7,379,298 B2 | * | 5/2008 | Walsh et al. | 361/692 |
| 2002/0000342 A1 | * | 1/2002 | Yamada et al. | 181/204 |

(Continued)

FOREIGN PATENT DOCUMENTS

JP   62071298   4/1987

(Continued)

*Primary Examiner* — Lincoln Donovan
*Assistant Examiner* — Forrest M Phillips
(74) *Attorney, Agent, or Firm* — Arent Fox, LLP (57) ABSTRACT

A silencer that reduces a noise from a noise source in a first housing that houses the noise source in a first internal space includes a second housing that houses the noise source in a second internal space, and is provided in the first internal space of the first housing, and a connector that is provided in the second housing and connects the first internal space to the second internal space, a space inside the first internal space but outside the second internal space being used to reduce the noise and wider than the second space.

6 Claims, 9 Drawing Sheets

U.S. PATENT DOCUMENTS

| | | |
|---|---|---|
| 2002/0015640 A1* | 2/2002 | Nishiyama et al. ............ 415/119 |
| 2002/0157897 A1* | 10/2002 | Hofmann et al. ............. 181/214 |
| 2003/0056941 A1* | 3/2003 | Lai et al. .................. 165/104.33 |
| 2003/0057015 A1* | 3/2003 | Helber et al. ................. 181/240 |
| 2003/0161102 A1* | 8/2003 | Lee et al. ...................... 361/687 |
| 2003/0183446 A1* | 10/2003 | Shah et al. .................... 181/205 |
| 2005/0161280 A1* | 7/2005 | Furuya .......................... 181/225 |
| 2005/0252712 A1* | 11/2005 | Gau et al. ..................... 181/224 |
| 2006/0054380 A1* | 3/2006 | Doll ............................... 181/225 |
| 2006/0185931 A1* | 8/2006 | Kawar .......................... 181/202 |
| 2006/0238979 A1* | 10/2006 | Liu ............................... 361/699 |
| 2008/0169152 A1* | 7/2008 | Furuya ......................... 181/224 |
| 2008/0257346 A1* | 10/2008 | Lathrop et al. ............ 128/204.17 |

FOREIGN PATENT DOCUMENTS

| | | |
|---|---|---|
| JP | 06124092 A * | 5/1994 |
| JP | 08-148868 | 6/1996 |
| JP | 2001-222065 | 8/2001 |
| JP | 2002-280784 | 9/2002 |
| JP | 2004317999 * | 11/2004 |
| WO | WO 2004/061817 A1 | 7/2004 |

\* cited by examiner

SILENCER AND ELECTRONIC APPARATUS HAVING THE SAME

This application is a continuation of PCT International No. PCT/JP2005/016100, filed on Sep. 2, 2005, which is hereby incorporated by reference herein in its entirety as if fully set forth herein.

BACKGROUND OF THE INVENTION

The present invention relates generally to a silencer that reduces noises from a noise source, and an electronic apparatus having the same. The present invention is suitable, for example, for a silencer that reduces noises from a cooling fan for cooling a CPU in an electronic apparatus such as a personal computer ("PC").

Along with the recent widespread electronic apparatuses, a high-performance, high-environmental-performance and small PCs have been increasingly demanded. For high-performance actions, both the number of exoergic circuit elements, such as CPUs, and each exoergic element's calorific value are likely to increase. Since the heat may damage the exoergic element and surrounding circuit elements or cause their operational failures, a cooling system that uses a cooling fan for cooling is conventionally proposed. The term "cooling" in this specification is a concept that covers heat radiations.

However, this cooling fan becomes a noise source and aggravates the environmental performance. Therefore, a PC having a silencer that reduces noises is proposed. One illustration is to provide a silencer to a duct in the cooling system that houses a cooling fan in the duct and sends winds to and cools a downstream exoergic element in the duct. See, for example, PCT International Publication No. WO04/061817. The duct serves as a housing that defines a space that encloses a noise source, such as the cooling fan, and the silencer serves to reduce noises in the space or at the exit of the space.

Figure 10:
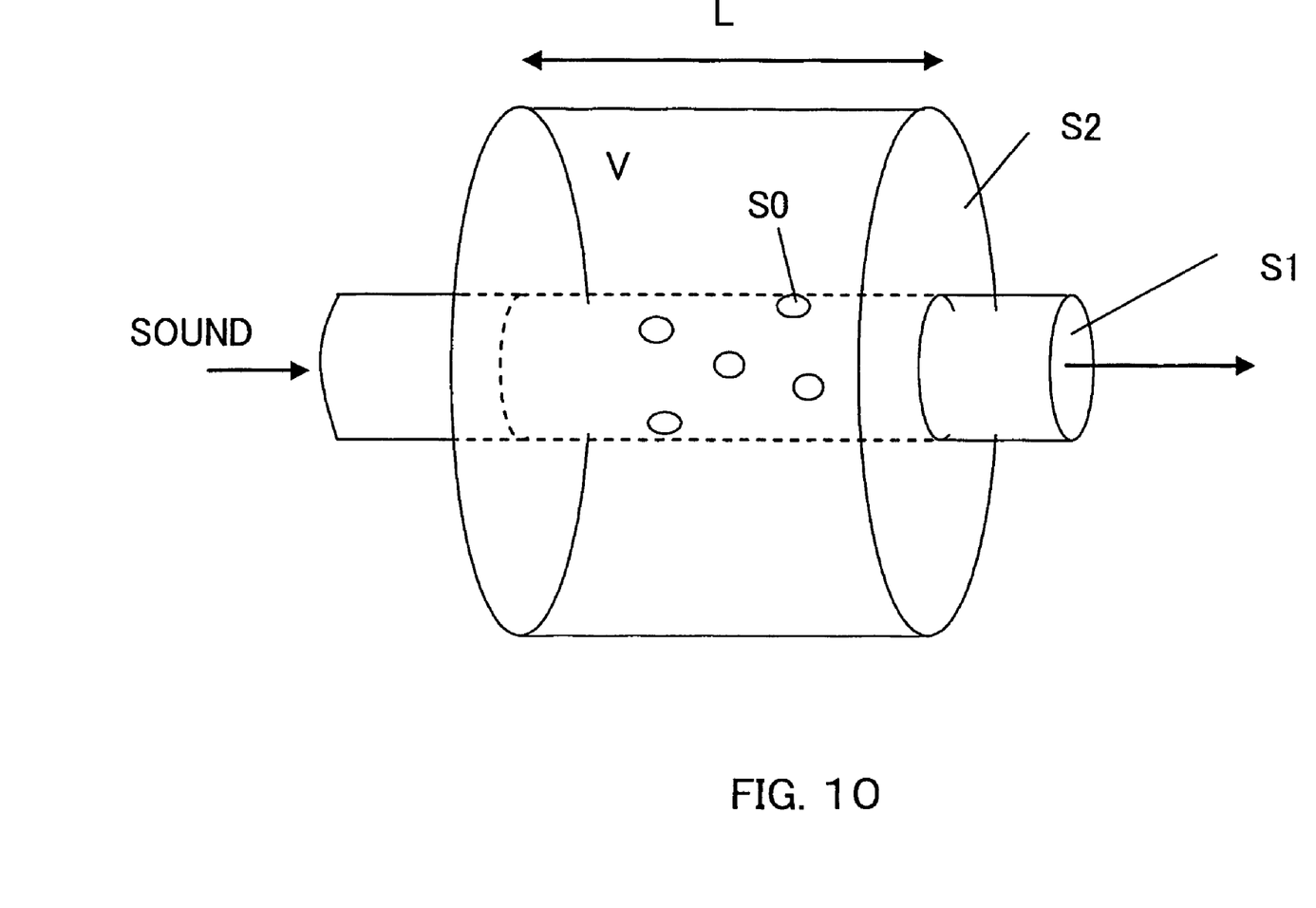
FIG. 10 is a schematic perspective view for explaining the conventional sound attenuating theory.
Figure 11:
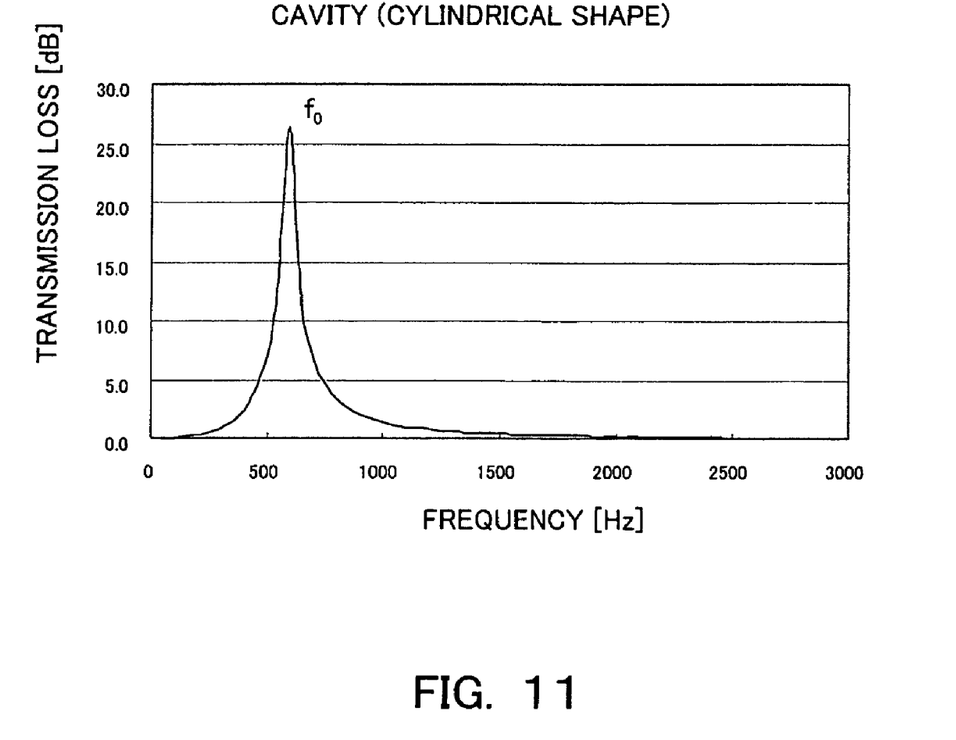
FIG. 11 is a graph showing a frequency characteristic illustration of a sound attenuating quantity of a silencer.

FIG. 10 is a schematic perspective view of a silencer for explaining a typical sound attenuation theory. FIG. 11 is a frequency characteristic of the silencer's sound damping quantity. See, for example, FIG. 1 of PCT International Publication No. WO 04/061817.

Other prior art include, for example, Japanese Patent Application, Publication No. 2001-222065.

According to Aritomo Nakano, "Ultrasonic (inaudible sound)—fundamental, measurement, evaluation, reduction measures," Gijyutu Shoin, Jun. 20, 1994, p. 98, a frequency $f_0$ of a sound-attenuated target is theoretically given by the following equation:

$$f_0 = \frac{c}{2\pi}\sqrt{\frac{c_0}{V}} \qquad \text{EQUATION 1}$$

$S_1$ is a tube's sectional area (m$^2$), V is a cavity's capacity (m$^3$), $c_0$ is an electrical conductivity (S/m), $S_0$ is a pore's area (m$^2$), $c_0 = S_0/l_e$, $l_e$ is a tube end correction length (m), n is the number of pores, d is a pore's diameter (m), and $c_0 = nS_0/(t+0.8\sqrt{S_0})$. When t is sufficiently small, $c_0 \sim d$.

A theoretical equation of the sound damping quantity (transmission loss) is given as follows:

$$TL = 10\log\left\{1 + \left(\frac{\sqrt{c_0 V}/2S_1}{f/f_0 - f_0/f}\right)^2\right\} \qquad \text{EQUATION 2}$$

From Equations 1 and 2, as the cavity's capacity V of the silencer increases, the low-frequency sound can be deadened and the sound damping quantity becomes large. The noise of the cooling fan is the low-frequency sound between about 500 Hz and about 1000 Hz, and it is thus necessary to increase the capacity of the silencer housed in the duct for effective sound deadening. However, as the silencer's capacity increases, the duct and the PC's housing enlarge contrary to a demand for the miniaturization.

BRIEF SUMMARY OF THE INVENTION

Accordingly, it is one illustrative object of the present invention to provide a silencer that can realize a low-noise and small electronic apparatus, and the electronic apparatus having the same.

A silencer according to one aspect of the present invention that reduces a noise from a noise source in a first housing that houses the noise source in a first internal space includes a second housing that houses the noise source in a second internal space, and is provided in the first internal space of the first housing, and a connector that is provided in the second housing and connects the first internal space to the second internal space, a space inside the first internal space but outside the second internal space being used to reduce the noise and wider than the second space. This silencer uses, when the connector has plural pores, a space between the second housing, such as a duct, and the first housing, such as a PC's housing, for the air layer (cavity) of the silencer, and can reduce the noise by the resonance. This silencer maximizes the space that is inherently provided in the first housing with no additional spaces, making the connector's structure simple. The configuration that provides the air layer to the inside of the second housing as in the prior art makes the second housing and ultimately the first housing undesirably large. On the other hand, the air layer if made small so as to maintain the size of the second housing makes the frequency of the sound-attenuated target higher (such as 2 kHz) than the target frequency (such as one between about 500 Hz and about 1,000 Hz), deteriorating the sound-attenuation effect, reducing the sound-damping quantity itself, or lowering the sound-damping efficiency. The silencer of the present invention solves these problems with a simple structure. Alternatively, when the connector has a cutout provided in the second housing, noises are reflected in the space between the first housing and the second housing and cancel each other or attenuate.

The silencer may further include a sound reflector in the first internal space of the first housing outside the second housing. Thereby, when the first housing has an opening, such as a suction port, the noise can be prevented from being leaking out of the opening. One illustration of this sound reflector is a partition provided near the second housing. Alternatively, the first housing may have an opening that serves as a connector between the first internal space and outside air. The silencer may further include a sound reflector that covers the opening in the first internal space of the first housing outside the second housing. Moreover, the sound reflector may be a bag that covers the connector, is located in the first internal space, and is attached to the second housing. The sound reflector coated with metal can reduce the noise that leaks to the outside of the sound reflector. The sound reflector is effective in adjusting the capacity of the air layer.

The silencer may further include a shield that covers the connector and transmits the noise. Such a shield is unlikely to transmit the air, in particular the wind. This configuration reduces the noise, when the connector has plural pores and the air moves from the second housing to the first internal space via the connector. The connector having a cutout can secure the airflow into the second internal space.

An electronic apparatus according to another aspect of the present invention includes a first housing that houses a noise source in a first internal space, and the above silencer that reduces a noise from a noise source. The electronic apparatus may further include an exoergic circuit element, and the noise source may be a cooling fan configured to cool the exoergic circuit element. When such an electronic apparatus uses a high-performance CPU, the noise of the cooling fan that radiates the CPU can be reduced without increasing the size of the electronic apparatus. An electronic apparatus according to another aspect of the present invention includes a first housing that houses at least one units, and a second housing that is housed in the first housing and houses a noise source, a cavity of a silencer being formed by a space between the first housing and the second housing, the space being wider than the second space.

Other objects and further features of the present invention will become readily apparent from the following description of the preferred embodiments with reference to accompanying drawings.

DETAILED DESCRIPTION OF THE PREFERRED EMBODIMENTS

Figure 1:
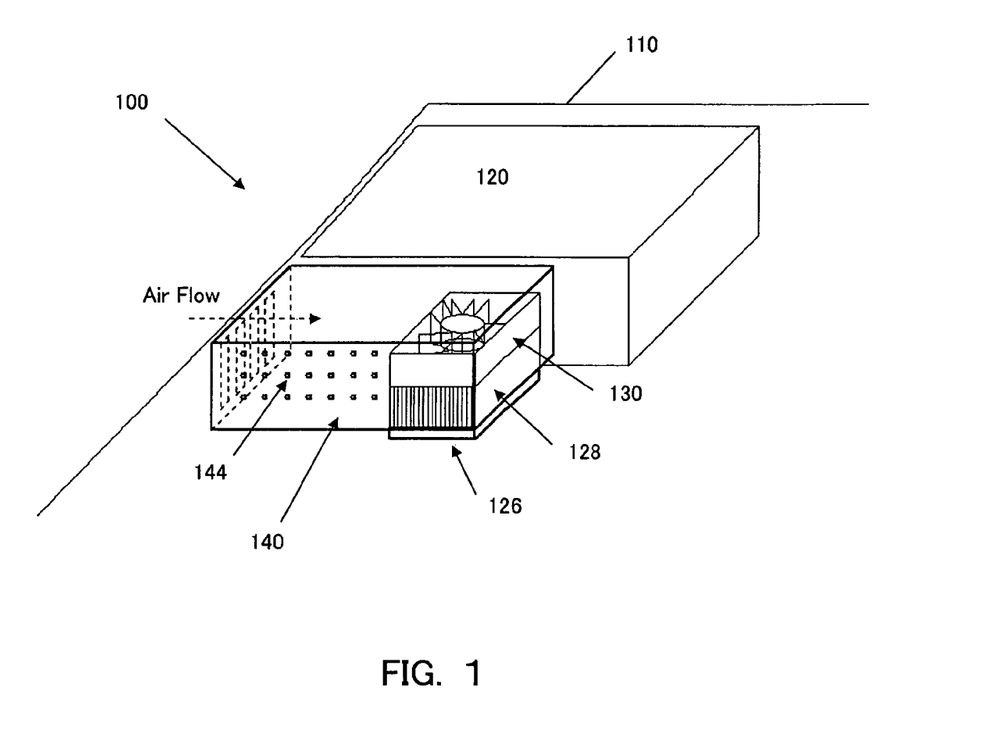
FIG. 1 is a schematic, partially perspective view of a desktop PC (electronic apparatus) according to one aspect of the present invention.
Figure 2:
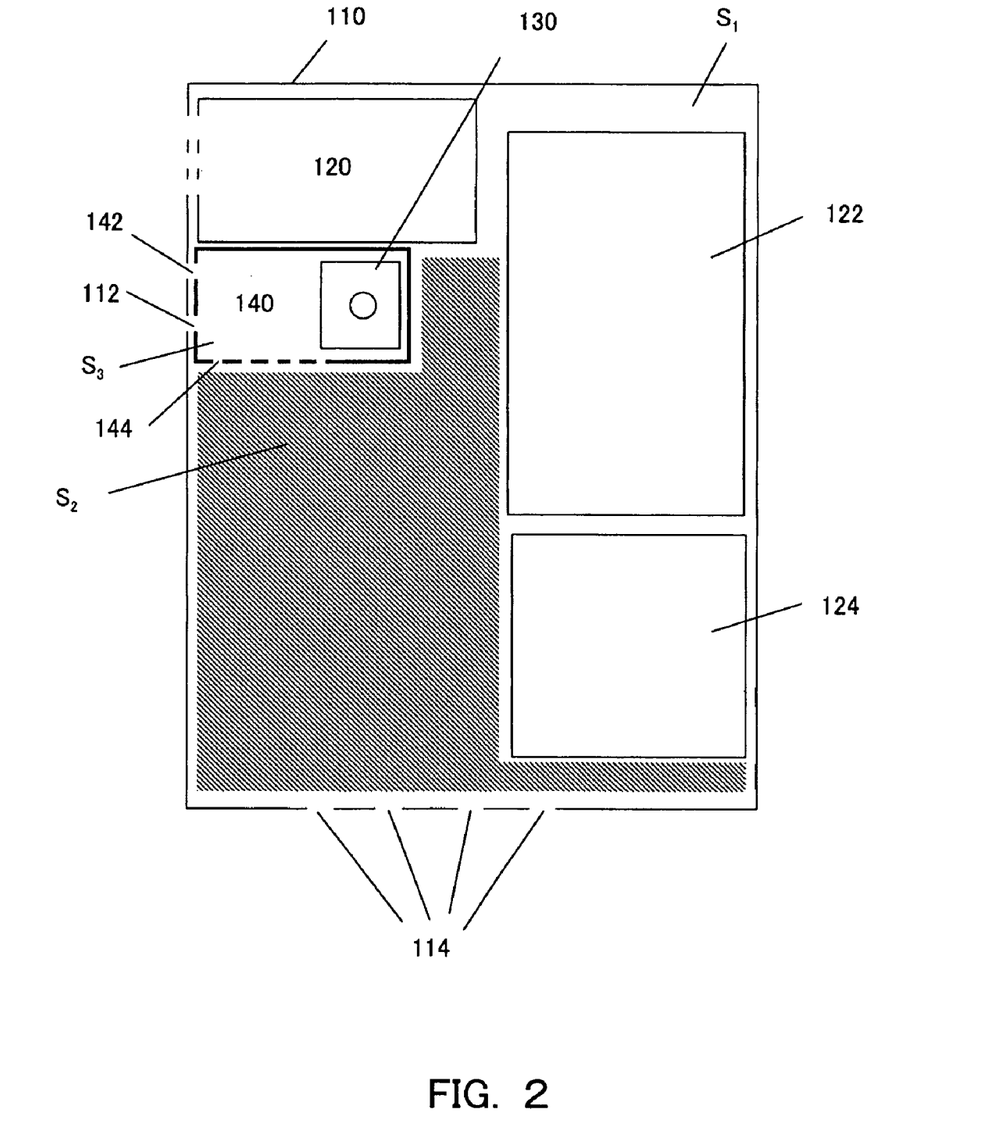
FIG. 2 is a block diagram of the desktop PC shown in FIG. 1.

Referring now to the accompanying drawings, a description will be given of a desktop PC (electronic apparatus) 100 according to one aspect of the present invention. Here, FIG. 1 is a schematic, partially perspective view of the desktop PC 100, and FIG. 2 is a block diagram of the desktop PC 100. As shown in FIGS. 1 and 2, the desktop PC 100 includes, in its internal space $S_1$ of the housing 110, a power unit 120, various drives 122, an FDD 124, a CPU 126, a heat sink 128, a cooling fan 130, and a duct 140.

The housing 110 has an approximately rectangular parallelepiped shape, and has a space $S_2$ that has no component, as hatched in FIG. 2. This embodiment utilizes this space $S_2$ for an air layer (cavity) of a silencer, as described later. The housing 110 has suction ports 112 and 114 to take the outside air in the internal space $S_1$. The suction ports 112 are provided in a back surface of the housing 110, and the suction ports 114 are provided in a bottom surface of the housing 110.

The power unit 120 is supplied with the power from the external power source (not shown), and supplies the power to each component. A cooling fan is provided in the power unit 120, and serves as a noise source. The various drives include an HDD, a CD-ROM drive, a magneto optic disc drive, a DVD-ROM drive, a DVD-RAM drive, and a DVD-RW. The various drives have disc driving motors, and each motor serves as a noise source. The FDD 124 is a well-known floppy disc drive. The FDD 124 has a disc driving motor, and this motor is a noise source.

The CPU 126 is an exoergic element configured to control each component, and exoergic elements in the housing 110 are not limited to the CPU 126 but include a chipset.

The heat sink 128 and the cooling fan 130 serve as a so-called fan-cum heat sink. The heat sink 128 typically includes a multiplicity of cooling fins made of a high heat transferring material, and radiates the exoergic element through natural air-cooling. However, the natural air-cooling is less likely to eliminate the heating value of the recent exoergic element, and thus the fan-cum heat sink that further includes the cooling fan 130 is proposed in order to enhance the cooling effect of the heat sink 128. The fan-cum heat sink compulsorily radiates the heat sink 128 through an airflow generated by the cooling fan 130. One type of the cooling fan 130 has a suction direction aligned with an exhaust direction, while another type of the cooling fan 130 orthogonally arranges the suction direction to the exhaust direction. The present invention is applicable to both types. In addition, one type of the cooling fan 130 is arranged parallel to a substrate (not shown) and another type of the cooling fan 130 is arranged perpendicular to the substrate. The present invention is applicable to both types. The cooling fan 130 is a noise source in the desktop PC 100. The cooling fan 130 of this embodiment sucks the air in a broken arrow direction shown in FIG. 1, and exhausts the air towards the heat sink 128.

The duct 140 is a cooling air passage, and supplies the outside air to the cooling fan 130. The duct 140 enables the outside cooling air to be supplied from the cooling fan 130 to the heat sink 128, rather than the warm air that contains the heats of the electronic components around the CPU 126. In addition, the duct 140 of this embodiment constitutes part of the silencer. The duct 140 has a rectangular parallelepiped shape that defines an internal space $S_3$, and houses the cooling fan 130 in the internal space $S_3$. The duct 140 is made, for example, by resin molding or metal plate folding. The duct 140's rectangular parallelepiped opens below the cooling fan 130 (at the side of the heat sink 128). The duct 140 has suction ports 142 and plural pores 143.

The suction ports 142 are formed in a back surface of the duct 140, and communicate with the suction ports 112 of the housing 110. The suction ports 142 supply the outside air to the cooling fan 130 via the suction ports 112, and serve as the supply ports for the cooling wind.

Figure 3:
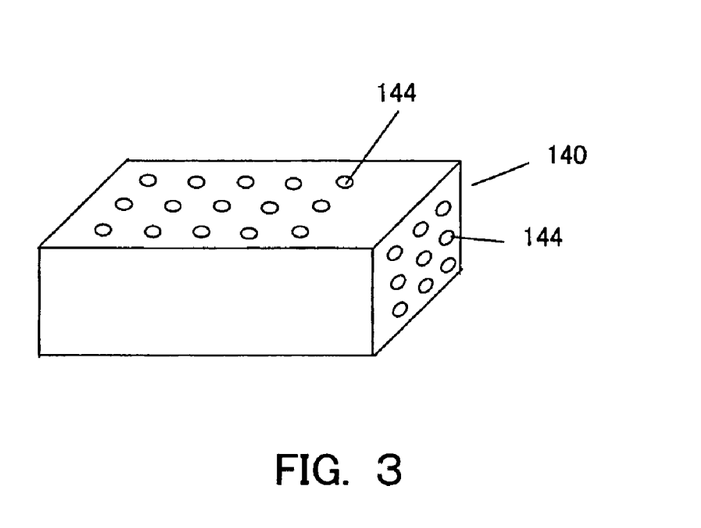
FIG. 3 is a schematic perspective view of a duct of the desktop PC shown in FIGS. 1 and 2 having plural sound attenuating pores in two surfaces.

The plural pores 143 are formed in a bottom surface of the duct 140, and are used for sound attenuations using the resonance. The surface having the plural pores 143 may be any surfaces except for the surface having the suction ports 142 of the duct 140, and the pores 143 may be formed in plural surfaces of the duct 140, as shown in FIG. 3. Here, FIG. 3 is a schematic perspective view of the duct 140 in which the plural pores 143 are formed in two surfaces. The plural pores 143 serve as a connector that connects the space $S_2$ in the internal space $S_1$ to the internal space $S_3$.

The prior art provides another housing in the duct. The other housing has the plural pores in the top surface, and other surfaces are sealed so as to use the inside of the housing for the air layer. Therefore, an attempt to secure a large capacity of the air layer causes a large duct and finally a large housing 110 contrary to a demand for the small housing 110. On the other hand, when the capacity of the air layer is made small, the frequency becomes too high from Equation 1 to eliminate the noise of the cooling fan 130 as the low-frequency sound, and the sound attenuation efficiency lowers from Equation 2.

On the other hand, this embodiment provides the plural pores 143 to the duct 140, and connects the pores 143 to the space $S_2$ so as to utilize the space $S_2$ for the air layer (cavity) of the silencer, and to use the resonance to reduce the noise. The space $S_2$ is a space that contains no electronic component and is originally provided in the space $S_1$. The space $S_2$ is not an additional space, and does not cause the housing 110 to be larger. The space $S_2$ is wider than the space $S_3$, effectively reduces the noise of the cooling fan 130 as the low-frequency sound from Equation 1, and enhances the sound attenuation efficiency from Equation 2.

Various equations have been proposed as the sound attenuation principle, and are not limited to Equations 1 and 2. See, for example, PCT International Publication No. WO04/061817. Equations 1 and 2 do not include an interval of the pores 143, an orientation of the surface having the pores 143, the number of surfaces having the pores 143, and a thickness of the duct 140. However, the present invention allows these parameters to be set based on another theoretical equation relating to the sound attenuation principle.

The silencer may further include a sound reflector outside the duct 140 in the internal space $S_1$ of the housing 110. The housing 110 has the suction ports 114 and leaks the noises. The sound reflector arranged between the suction port 114 and the duct 140 prevents leaks of the noises from the cooling fan 130 out of the suction ports 114. The housing 110 has a problem because it has an opening, such as a suction port and an aperture, and the airtight sealing of the air layer is imperfect and the sound attenuating frequency differs from the theory. The sound reflector can solve this problem. The sound reflector is also effective in adjusting the capacity of the air layer, e.g., when the internal space $S_2$ is too wide for the target frequency.

Figure 4:
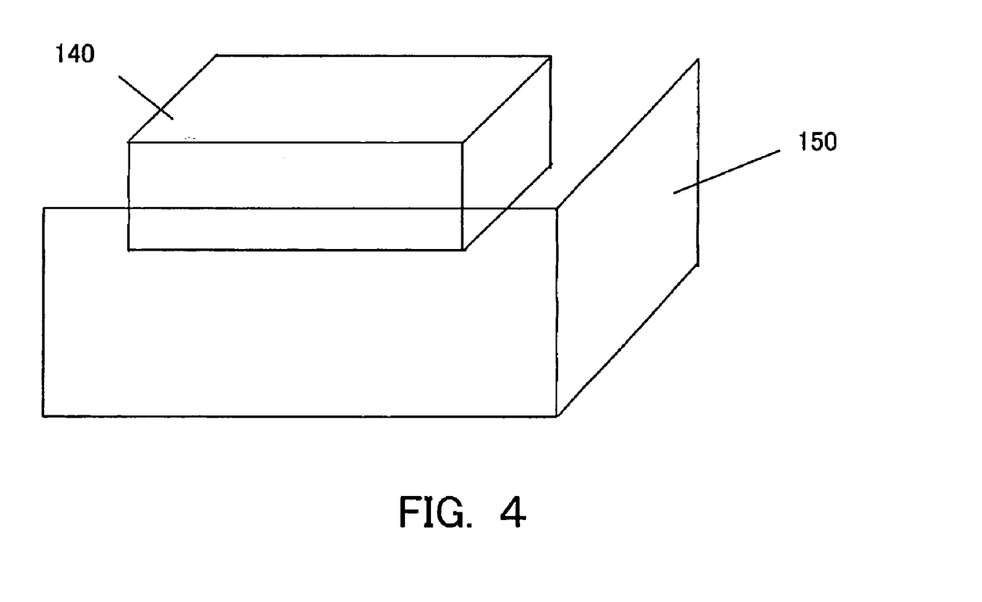
FIG. 4 is a schematic perspective view of a sound reflector (partition) of a first embodiment arranged around or near the duct shown in FIG. 1.

The sound reflector of a first embodiment is a partition 140 shown in FIG. 4. Here, FIG. 4 is a schematic perspective view of the partition 150. The partition 150 is an L-shaped member provided around or near the duct 140. The partition 150 is made of a PET or polyethylene plate member, and a film. In FIG. 2, when the partition 150 is arranged (for example, in the middle) between the suction ports 114 and the duct 140, an available range for the air layer is a space between the duct 140 and the partition 150. Although this configuration reduces the volume of the air layer and thus slightly lowers the sound attenuation efficiency, the noises that leak out of the suction port 114 also reduce.

Figure 5:
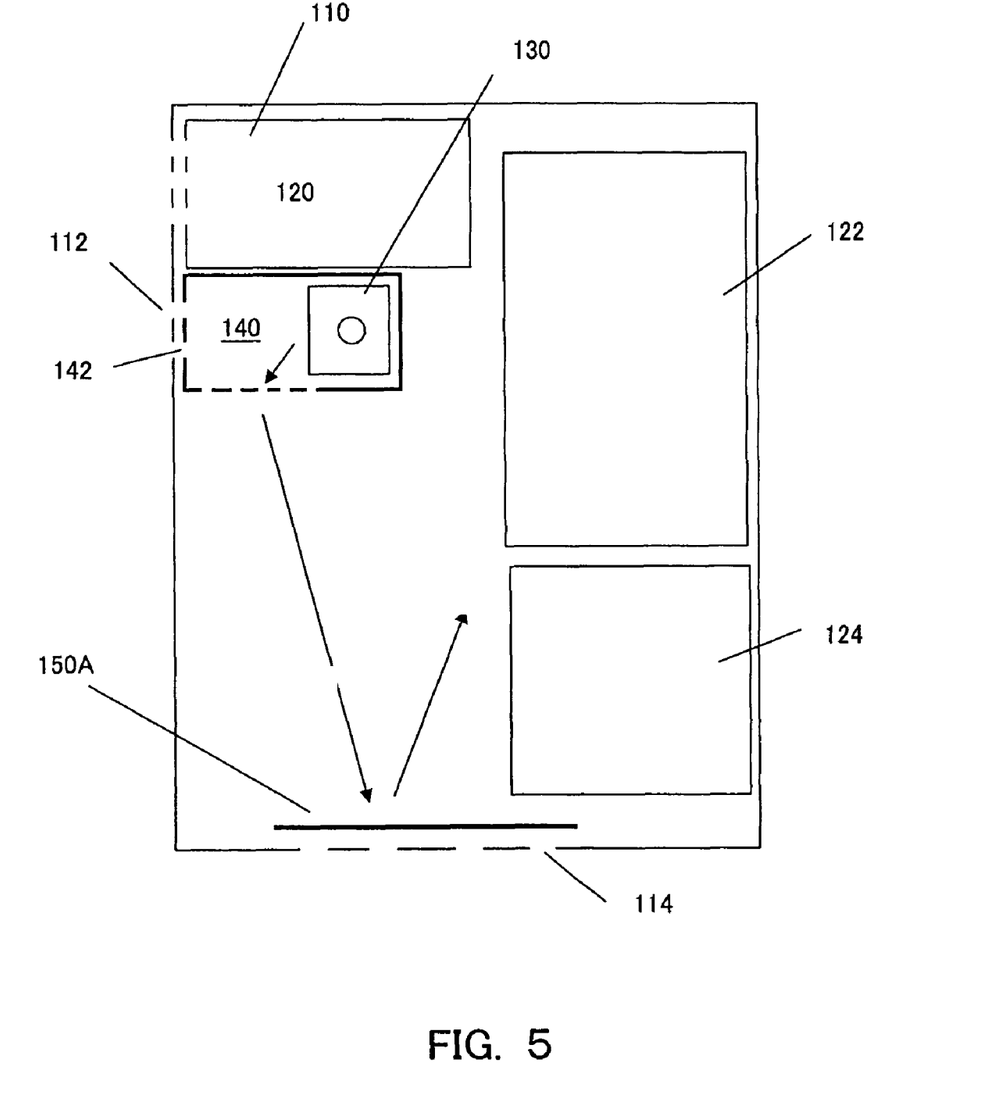
FIG. 5 is a block diagram of the desktop PC shown in FIG. 2 having a sound reflector (reflector plate) of a second embodiment.

The sound reflector of a second embodiment is a sound reflector 150A shown in FIG. 5. Here, FIG. 5 is a schematic plane view of the desktop PC 100 having the sound reflector 150A. The sound reflector 150A is as wide as or wider than the suction ports 114, does not close the suction ports 114, and maintains the suction air. The sound reflector 150A reflects the sounds so that the noises from the cooling fan 130 do not leak to the outside. The sound reflector 150A seldom reduces the space $S_2$, and thus maintains the volume of the air layer. Therefore, the noise reduction effect is maintained, and the noise that leaks from the suction port 114 reduces. This embodiment provides the sound reflector 150A near the suction ports 114, but the sound reflector 150A may be provided near all openings, such as a suction port and an exhaust port, in the housing 110.

Figure 6:
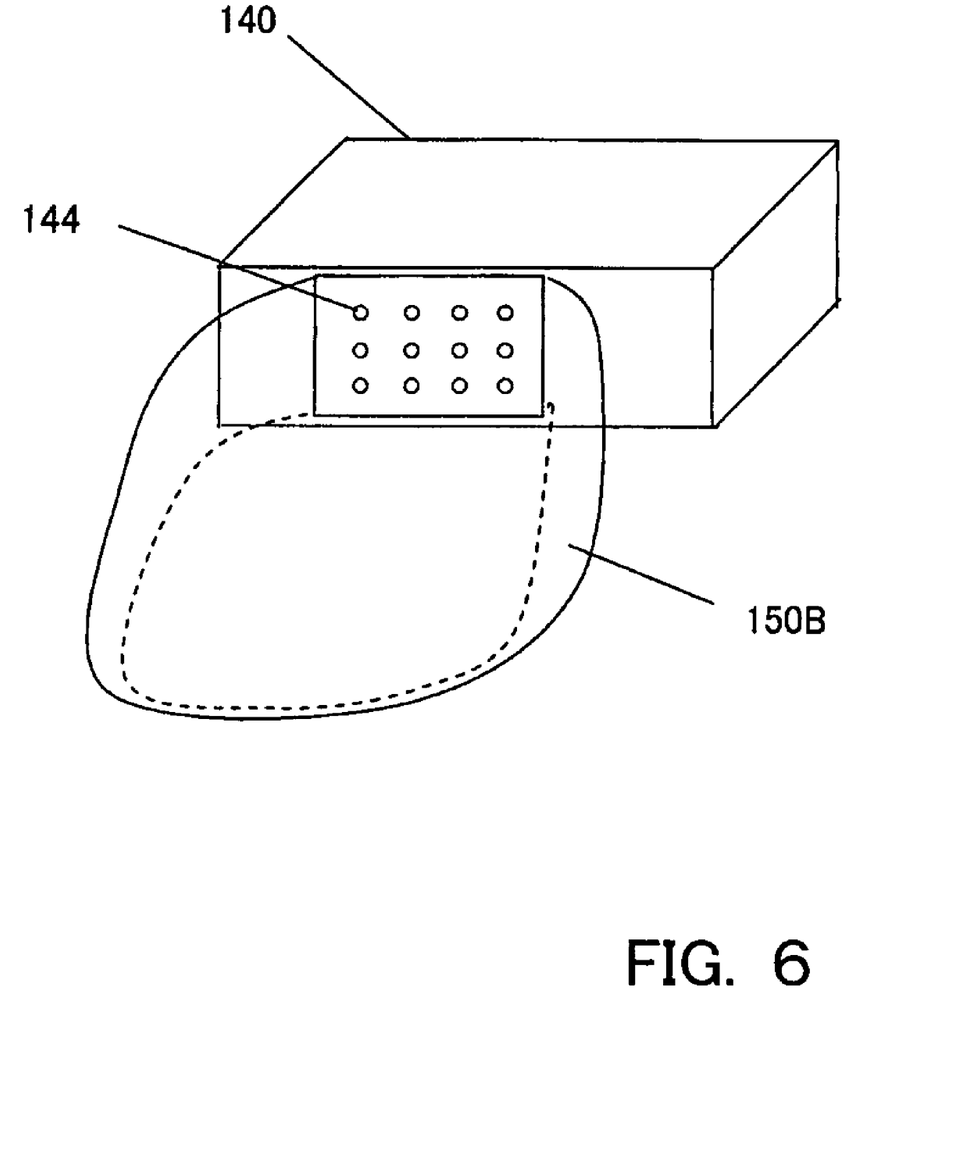
FIG. 6 is a schematic perspective view of the duct shown in FIG. 1 to which a sound reflector (bag) of a third embodiment is attached.

The sound reflector of a third embodiment is a bag 150B shown in FIG. 3. Here, FIG. 6 is a schematic perspective view of the duct 140 to which the bag 150B is attached. The bag 150B can shield the air, and be used for the air layer of the silencer. The internal space $S_1$ of the housing 110 may be narrower due to an additional unit, such as a PCI card and a secondary HDD, and it becomes difficult to provide the partition 150. The bag 150B is soft and facilitates the installation. The bag 150B is coated with metal in order to enhance the sound reflectance. Metal coating may be applied to the sound reflectors 150A and 150B. The bag 150B with a certain capacity does not significantly reduce the capacity of the air layer shown in FIG. 2, but reduces the noises that leak out of the suction ports 114.

Figure 7:
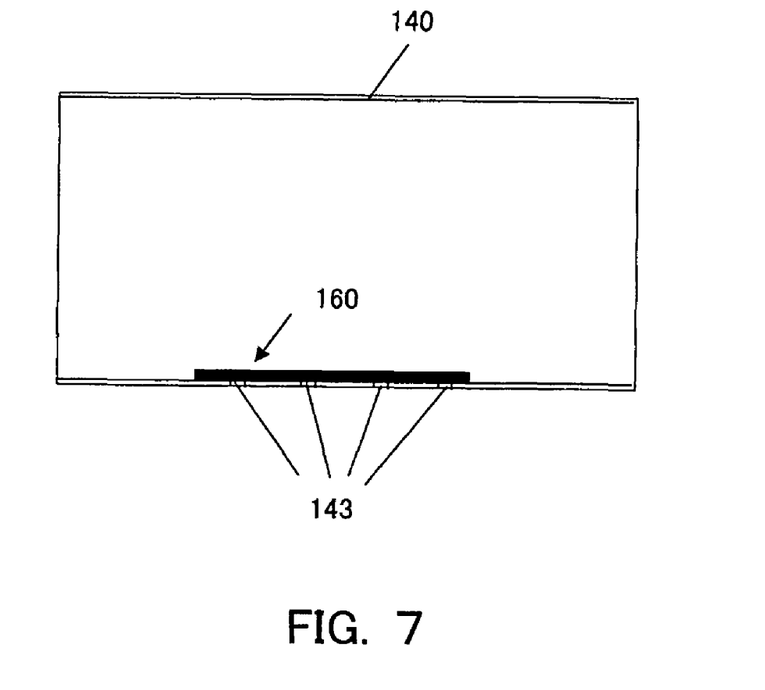
FIG. 7 is a schematic sectional view of the duct in which a shield (sheet) is attached to plural sound attenuating pores shown in FIG. 2.

The silencer may further include a shield 160 that covers the pores 143, and allows sound's penetrations but is unlikely to penetrate the air, in particular the wind. As discussed above, the inside of the duct 140 is a wind's passage, but the wind when leaking out of the pore 143 causes noises, such as whooshes. The shield 160 of the first embodiment prevents the wind leakages and reduces the noises, while introducing the noises from the cooling fan 130 into the air layer (space $S_2$) shown in FIG. 2 for attenuations. The shield 160 is a sheet member made, for example, of a nonwoven fabric, felt, paper, cloth, Sponge, urethane, a sound absorption material, and a foaming material. The shield 160 may be adhered only to the pores 143 in the duct 140 or all the inside surfaces of the duct 140. FIG. 7 is a schematic sectional view of the duct 140 to which the shield (sheet) 160 is adhered.

Figure 8:
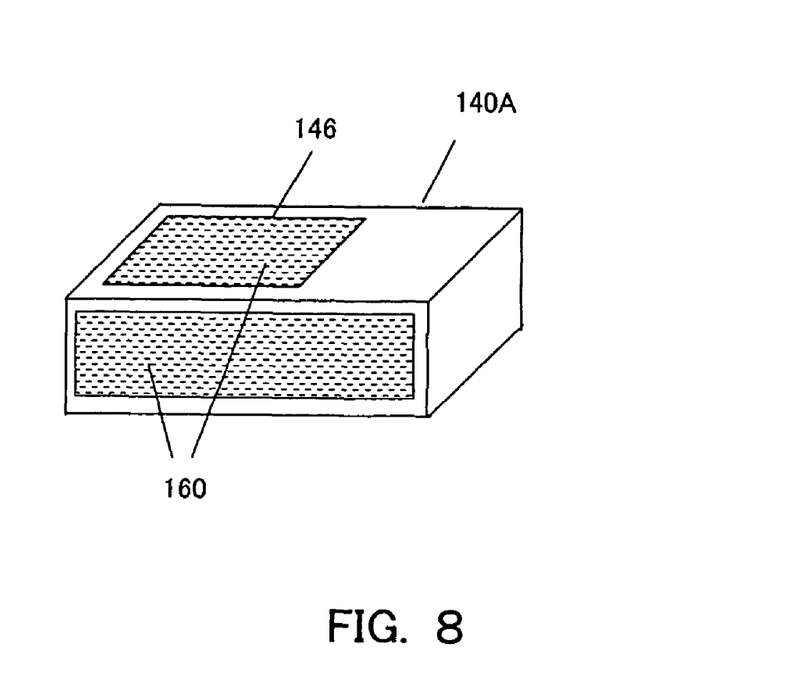
FIG. 8 is a schematic perspective view of the duct in which a shield (sheet) is attached to a cutout.

A shield 160 of a second embodiment is adhered to a cutout after the cutout is formed in the duct 140. When the duct 140 is made of resin, as discussed above, it does not transmit the sound much, and instead the noise from the suction port 142 becomes larger. Accordingly, the duct 140 is made of resin etc., and partially cut so that the duct 140 can maintain its rigidity and the sound can leak in the internal space $S_2$. When the noises from the cooling fan 130 leak in the internal space $S_2$, some acoustic components are reflected in that space and cancel each other and attenuate, providing a sound attenuation effect. FIG. 8 is a schematic perspective view of the duct 140A that has two cutouts 146 and shields 160 adhered to the cutouts 146. While the cutout 146 serves as a connector that connects the space $S_2$ of the internal space $S_1$ to the internal space $S_3$, it does not have a function of the pore in Equation 1 unlike the pore 143. The surface, size, and shape of the cutout 146 are not limited, and it is necessary to make the area of the cutout 146 as large as possible to reduce the noise at the suction ports 142. The shield 160 adhered to the duct 140A can secure the flow of the outside air that is cooler than the air in the housing 110 sucked from the suction ports 114.

First Embodiment

Figure 9:
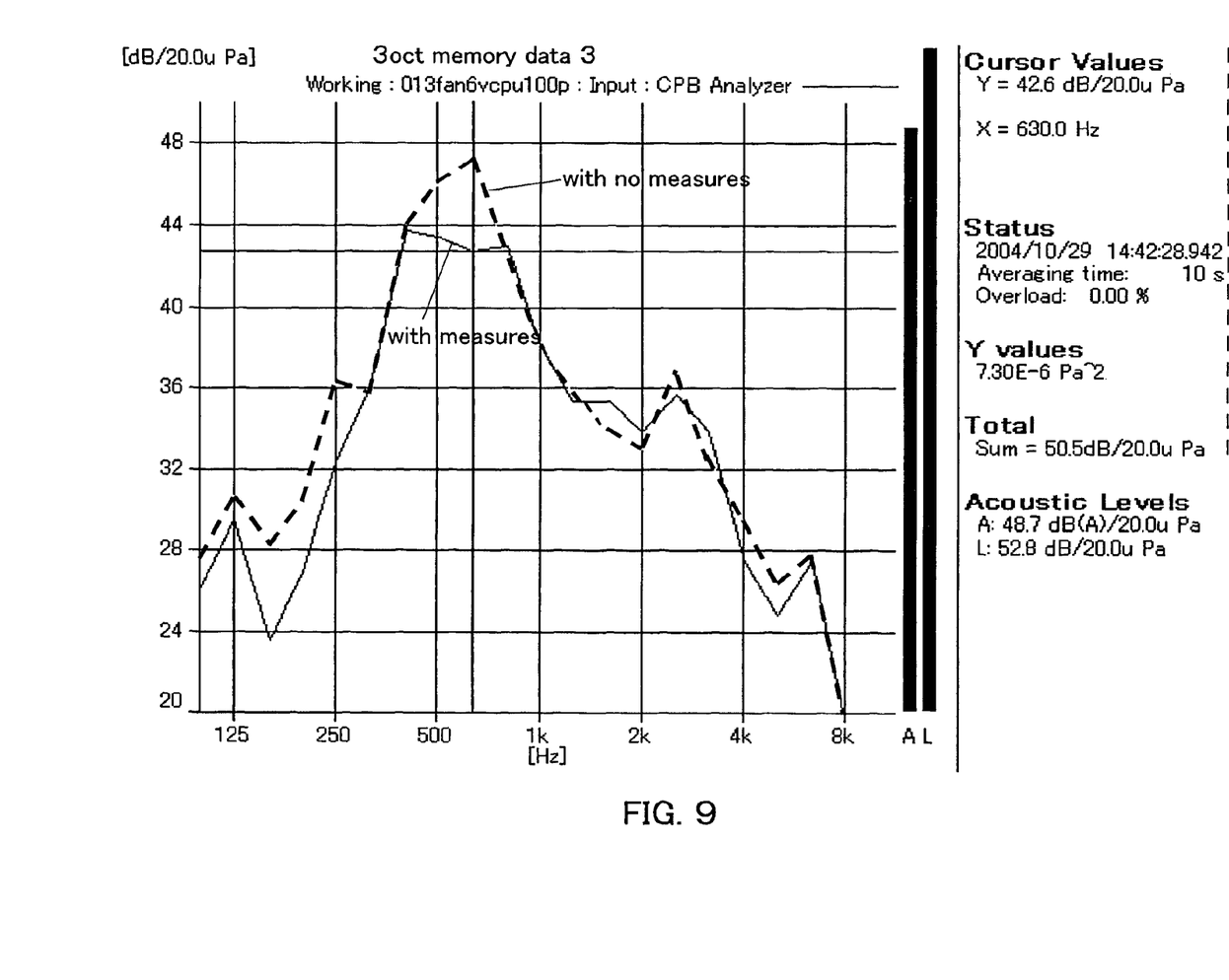
FIG. 9 is a graph showing a sound attenuating effect of the desktop PC having the duct shown in FIGS. 2 and 7.

FIG. 9 shows a sound attenuation effect of a structure (shown in FIG. 7) that adheres the nonwoven fabric shield 160 to the duct 140 shown in FIG. 2. The noise of the housing 110 was 50.2 dB before the duct 140 is provided with the pores 143 (before the noise measure is taken). The noise of the housing 110 reduced down to 48.7 dB after the duct 140 is provided with the pores 143 (after the noise measure was taken) and the noise reduction effect by 1.5 dB was recognized.

As to the frequency component, the silencer (that used the nonwoven fabric) reduced noises near 630 Hz with the mainly ⅓ octave band center frequency. The applied electronic apparatus was a Fujitsu space-saving PC. A measurement position is an operator position determined by JIS X 7779: 2001. In the operational state, the cooling fan 130 has 100% duty, the power fan has 6V, and the HDD is in the standby (when the spindle rotates).

Further, the present invention is not limited to these preferred embodiments, and various modifications and variations may be made without departing from the spirit and scope of the present invention. For example, this embodiment discusses the desktop PC, but the electronic apparatus of the present invention is broadly applicable to a server and a laptop PC. The silencer of this embodiment attenuates noises from the cooling fan 130 for the CPU 126, but may attenuate noises from a motor in the power unit 120 and drives 122 and 124. Moreover, the silencer itself is broadly applicable to a refrigerator, a bike, an airplane, and a ventilation fan.

The present invention can thus provide a silencer that can realize a low noise and small electronic apparatus, and an electronic apparatus having the same.

What is claimed is:

1. An electronic apparatus comprising:
   a first housing that houses at least one units, a cavity being formed in an internal space of the first housing;
   a second housing that is housed in the first housing, and houses both a heat sink and a fan as a noise source configured to generate an airflow used to radiate the heat sink, both an air inlet opening and an air outlet opening of the fan being housed in the second housing, the second housing having a plurality of holes configured to connect an internal space of the second housing to the cavity of the first housing and to introduce a sound wave as the noise to the cavity, the cavity being a space wider than the internal space of the second housing and located outside of the second housing; and
   a shield that covers the plurality of holes and transmits the noise.

2. An electronic apparatus according to claim 1, further comprising a sound reflector that is provided in the cavity of the first housing.

3. An electronic apparatus according to claim 1, wherein the first housing has an opening that serves as a connector between the internal space of the first housing and an external space to the first housing.

4. An electronic apparatus according to claim 3, further comprising a sound reflector that covers the opening and is provided in the cavity.

5. An electronic apparatus according to claim 2, wherein the sound reflector is a bag that covers the area corresponding to the plurality of holes is located in the cavity, and is attached to the second housing.

6. An electronic apparatus according to claim 2, wherein the sound reflector is substantially coated with metal.

\* \* \* \* \*